US010566031B2

(12) United States Patent
Brand

(10) Patent No.: US 10,566,031 B2
(45) Date of Patent: Feb. 18, 2020

(54) ELECTRONIC DEVICE HAVING AN INTERIOR THAT INCLUDES A SATURATED SALT SOLUTION AND A DESICCANT

(71) Applicant: Seagate Technology LLC, Cupertino, CA (US)

(72) Inventor: John L. Brand, Burnsville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/954,135

(22) Filed: Apr. 16, 2018

(65) Prior Publication Data

US 2019/0318767 A1 Oct. 17, 2019

(51) Int. Cl.

*G06F 1/16* (2006.01)
*H05K 5/00* (2006.01)
*H05K 7/00* (2006.01)
*G11B 33/14* (2006.01)
*G11B 33/02* (2006.01)
*H05K 5/06* (2006.01)
*G06F 1/18* (2006.01)

(52) U.S. Cl.

CPC .............. *G11B 33/14* (2013.01); *G06F 1/182* (2013.01); *G11B 33/022* (2013.01); *H05K 5/069* (2013.01)

(58) Field of Classification Search

CPC ... G06F 1/182; G06F 1/18–189; G11B 33/14; G11B 33/022; H05K 5/069; H05K 5/026; H05K 5/006; H05K 5/0047; H05K 5/0043; H05K 5/0039; H05K 5/0034

See application file for complete search history.

(56) References Cited

U.S. PATENT DOCUMENTS

| | | | | |
|---|---|---|---|---|
| 4,831,475 | A | | 5/1989 | Kakuda et al. |
| 5,037,459 | A | | 8/1991 | Spruill et al. |
| 5,075,807 | A | | 12/1991 | Inoue et al. |
| 5,392,177 | A | | 2/1995 | Chainer et al. |
| 5,936,178 | A | | 8/1999 | Saari |
| 6,088,190 | A | * | 7/2000 | Anderson .......... G11B 33/1486 360/99.18 |
| 6,266,208 | B1 | | 7/2001 | Voights |
| 6,453,679 | B1 | | 9/2002 | Aoyagi et al. |
| 6,921,026 | B2 | | 7/2005 | Saari et al. |
| 7,478,760 | B2 | | 1/2009 | Beatty et al. |
| 7,695,547 | B2 | | 4/2010 | Smith |
| 8,748,723 | B1 | | 6/2014 | Egberg et al. |
| 8,867,164 | B2 | | 10/2014 | Brown |
| 9,302,795 | B1 | | 4/2016 | Beatty et al. |
| 2009/0188386 | A1 | * | 7/2009 | Beatty ................ G11B 33/1453 95/91 |
| 2010/0296191 | A1 | * | 11/2010 | Kim .................. G11B 33/1453 360/97.12 |

OTHER PUBLICATIONS

Unpublished U.S. Appl. No. 16/041,389, filed Jul. 20, 2018 (No Copy Enclosed).

"The Control of Humidity by Saturated Salt Solutions", F. E. M. O'Brian, J. Sci. Instruments, vol. 25, 1948, pp. 73-76.

* cited by examiner

*Primary Examiner* — Anthony M Haughton

(74) *Attorney, Agent, or Firm* — Kagan Binder, PLLC

(57) ABSTRACT

The present disclosure includes embodiments of an electrical device that includes an interior having a saturated salt solution and desiccant disposed therein to manage the relative humidity of the interior.

18 Claims, 3 Drawing Sheets

ELECTRONIC DEVICE HAVING AN INTERIOR THAT INCLUDES A SATURATED SALT SOLUTION AND A DESICCANT

BACKGROUND

The present disclosure relates to managing the relative humidity within electronic devices such as data storage devices that use electrical power to store and retrieve data.

SUMMARY

Embodiments of the present disclosure include an electronic device including:

a) a housing having an interior space;

b) one or more electronic components disposed within the interior space;

c) a saturated salt solution disposed within the interior space; and d) a desiccant disposed within the interior space.

Embodiments of the present disclosure also include a method of making an electronic device, where the method includes:

a) providing a housing having an interior space;

b) disposing one or more electronic components within the interior space;

c) disposing a saturated salt solution disposed within the interior space; and d) disposing a desiccant disposed within the interior space.

DETAILED DESCRIPTION

Figure 1:
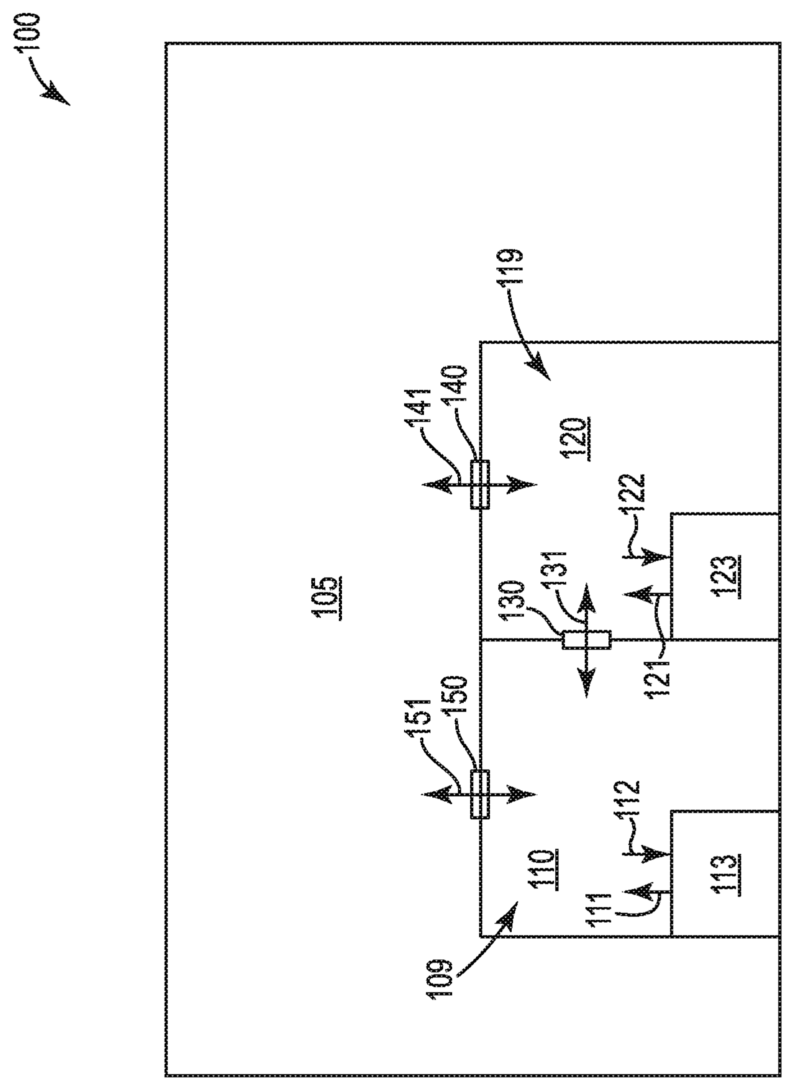
FIG. 1 shows a schematic, side view of a data storage device that includes a first environmental control module having a saturated salt solution disposed therein and a second environmental control module having a desiccant disposed therein.

The present disclosure relates to managing the relative humidity within electronic devices such as data storage devices that use electrical power to store and retrieve data. As used herein, "relative humidity" refers to the ratio of the partial pressure water vapor in a mixture of gas (e.g., air) and water to the equilibrium vapor pressure of water over a flat surface of water at a given temperature. The ratio can then be expressed as a percentage.

As used herein, a "desiccant" refers to a material that can absorb or desorb water at the same rates at equilibrium for a given temperature. Also, a desiccant can buffer an environment to changes (e.g., temperature) that can impact relative humidity. The equilibrium relative humidity can depend on, e.g., the type of desiccant, the volume of the desiccant, the total water in a closed system (e.g., in a gas (e.g., air) and in the desiccant), and temperature. In some embodiments, a desiccant can be pre-charged with an amount of moisture to facilitate maintaining a target relative humidity within a sealed environment. Pre-charging a desiccant can be performed by bolding the desiccant in a controlled environment at a prescribed relative humidity and temperature for a period a time until equilibrium is reached.

The amount of moisture to pre-charge a desiccant to set the desiccant to a moisture level sufficient to maintain a desired relative humidity may be determined using various processes. For example, the amount of moisture may be determined using a look-up table indicating respective amounts corresponding to a plurality of relative humidity levels for a specific amount and type of desiccant material and enclosure volume.

The desiccant (e.g., pre-charged desiccant) can be disposed in a hermetically sealed, interior space of an electronic device. If the temperature increases the desiccant can desorb water until the water content reaches a new equilibrium concentration with the surrounding environment for that new temperature. If the temperature decreases the desiccant can absorb more water until the water content reaches a new equilibrium concentration with the surrounding environment for that new temperature. Likewise, if the relative humidity increases due to material in the drive releasing humidity, the desiccant will absorb more water until the water content reaches a new equilibrium concentration within the drive environment for that new relative humidity.

As used herein, a "saturated salt solution" includes a liquid, aqueous phase and a salt (solute) dissolved therein at saturation conditions. A saturated salt solution has an equilibrium relative humidity for a given temperature. Advantageously, in some embodiments a saturated salt solution can control the relative humidity of a sealed environment within 10% or less of a target relative humidity, or even within 5% or less of a target relative humidity. The target relative humidity depends on the salt or salts that are selected. Saturated salt solutions can be used nominally from 0 to 100° C. so that water in solution is in the liquid phase. Melting point depression and boiling point elevation of a solution can increase this range.

In more detail, a closed system such as a hermetically sealed electronic device can have a saturated salt solution and humid gas disposed therein at equilibrium. First, for a solution at equilibrium in general, the partial pressure of water vapor in the gas is determined by the temperature, total pressure, and the solute (salt) concentration. The amount of a salt that will dissolve in water can be limited. In such a case, as more and more salt is added to a given volume of water, a point will be reached when further solute will not dissolve and some pure solute will be present as a distinct phase. This condition is known as saturation. The amount of salt that can be dissolved in water (the solubility limit) depends on the temperature and on the chemical composition of the salt.

If, in the closed system described above, the solution is a saturated solution, there will be a three-way equilibrium among the partial pressure of water vapor in the gas, the saturated solution of the solute dissolved in the water, and the pure solute present as a distinct, pure phase. This three-way equilibrium can respond to perturbations to maintain the equilibrium. For example, if the water vapor partial pressure in the closed system were increased, the solution would absorb some water vapor from the gas and dissolve more of the free solute. In this way, the partial pressure of water in the gas and the concentration of solute can be driven back towards their original levels. A decrease in the water vapor partial pressure would bring about the reverse process with some solute precipitating out of the solution and some liquid water evaporating to increase the water vapor partial pressure. In such a closed equilibrium system, the partial pressure of water vapor in the gas can be held to a specific value with little variation, even as temperature of the gas may vary. Therefore, the relative humidity of a closed equilibrium system that includes humid air, a saturated aqueous salt solution, and free solute (salt) can be fixed at a specific value, and can be relatively insensitive to changes in temperature within a given temperature range.

A saturated salt solution can be selected according to the present disclosure to control the relative humidity within the interior space of an electronic device to a relative humidity that is suitable for the electronic device (e.g., during storing, operation, and the like). For example, a saturated salt solution can be selected to provide a relative humidity so as to avoid one or more undesirable consequences to an undue degree because relative humidity is "too low" such as head-disc interface failure in a hard disc drive, and the like. A saturated salt solution can also be selected to provide a relative humidity so as to avoid one or more undesirable consequences to an undue degree because relative humidity is "too high" such as corrosion of sensitive electronic materials in a data storage device, and the like. In some embodiments, a saturated salt solution can be selected to control the relative humidity within the interior space of an electronic device to a nominal relative humidity from 5 to 60 percent at a temperature of 25° C., from 10 to 50 percent at a temperature of 25° C., or even from 10 to 45 percent at a temperature of 25° C. [ ]. For example, a saturated salt solution of LiCl can be selected to provide a nominal relative humidity of 13% at 25° C.; a saturated salt solution of potassium formate can be selected to provide a nominal relative humidity of 19% at 25° C.; a saturated salt solution of $CaCl_2$ can be selected to provide a nominal relative humidity of 31% at 25° C.; a saturated salt solution of $MgCl_2$ can be selected to provide a nominal relative humidity of 33% at 25° C.; a saturated salt solution of $K_2CO_3$ can be selected to provide a nominal relative humidity of 43% at 25° C.; etc.

A wide variety of salt solutions can be used according to the present disclosure. In some embodiments, a salt for salt solution is chosen from lithium chloride, potassium formate, calcium chloride, magnesium chloride, potassium carbonate, sodium chloride, potassium sulfate, potassium acetate, lithium bromide, desium fluoride, zinc bromide, lithium iodide, and combinations thereof.

A saturated salt solution according to the present disclosure can include one or more additives. Additives can be selected to modify viscosity, affect water absorption/desorption kinetics, density, pH, combinations of these, and the like. Exemplary additives can be chosen from sucrose, silica, xanthan gum, polysaccharides, agar, carrageenan, cellulose, alumina, saccharin, salicylic acid, and combinations thereof.

A saturated salt solution according to the present disclosure can be contained within a first container that is permeable to water vapor, and impermeable to liquid, ions, and solid. The first container is disposed within the interior space of a sealed electronic device. A wide variety of locations within an electronic device can be selected for disposing the first container. In some embodiments, the interior space of an electronic device can include a dedicated structure for housing the first container. In some embodiments, the dedicated structure can be what is referred to as an environmental control module. An environmental control module can be disposed within the interior space of an electronic device and the first container can be disposed within the environmental control module. An environmental control module can be a well-type structure that has a permeable cover that allows water vapor to readily pass through. Examples of environmental control modules are reported in U.S. Pat. No. 6,266,208 (Voights) and U.S. Pat. No. 8,867,164 (Brown), wherein the entireties of which patents are incorporated herein by reference.

A wide variety of constructions can be used for the first container. In some embodiments, the first container includes a sealed pouch. An example of a sealed pouch includes a sealed polymer membrane that encloses the saturated salt solution and that is permeable to water vapor, and impermeable to liquid and ions. In some embodiments, the polymer membrane can be made out of one or more polymeric fluorocarbons, polyesters, polyamides, styrene-butadiene copolymers, and combinations thereof. In some embodiments, the polymer membrane can be made out of polytetrafluoroethylene. In some embodiments, the polymer membrane can be made out of polyethylene terephthalate.

A desiccant can be selected according to the present disclosure to buffer the interior space of an electronic device against a change in relative humidity that may otherwise be caused by a change in temperature of the interior space. By buffering the interior space of an electronic device against a change in relative humidity, the relative humidity within the interior space of the electronic device can be maintained at a relative humidity that is suitable for the electronic device (e.g., during storing, operation, and the like). For example, the steady state interior temperature of a hard disk drive during operation can be in the range from 30 to 65° C. In some embodiments, a desiccant can be precharged in an environment having a relative humidity in the range from 5 to 60 percent at 25° C., from 10 to 50 percent at 25° C., or even from 15 to 45 percent at 25° C.

According to the present disclosure, a saturated salt solution and desiccant can both be used together to control the humidity within the interior space of an electronic device so as to help provide robust protection against changes in relative humidity within the interior space of a sealed electronic device, especially a hermetically sealed electronic device such as a hard disc drive, due to changes in temperature and/or desorption/adsorption of humidity by various materials in a drive. For example, a saturated salt solution can be selected to control the interior space of an electronic device to a target relative humidity within a temperature range and a desiccant can be selected to buffer changes in relative humidity that may be caused by a change in temperature so as to maintain the relative humidity at, or close to, to the target relative humidity while the saturated salt solution releases or absorbs water to control the relative humidity. In some embodiments, a saturated salt solution can be selected to control the relative humidity within the interior space to a first relative humidity from 10° C. to 75° C., and a desiccant can be precharged in an environment having a second relative humidity at 25° C. that is the same or different from the first relative humidity. The second relative humidity can be selected to be within 10% of the first relative humidity at a temperature in the range from 10° C. to 75° C. It is noted that relative humidity is specified throughout relative to 25° C. for reference purposes to refer to the storage temperature of an environmental control module and manufacturing or processing temperatures. For example, manufacturing or processing temperatures can range from 15-30° C., or even 18-26° C.

A wide variety of desiccants can be selected according to the present disclosure. Exemplary desiccants can be chosen from silica gel, activated alumina, alumina, calcium oxide, activated carbon, calcium sulfate, magnesium aluminum silicate, and combinations thereof. Desiccants can be included in any desired form such as granular form and/or bead form.

A desiccant according to the present disclosure can be contained within a second container that is permeable to water vapor. The second container can be disposed within the interior space. A wide variety of locations within an electronic device can be selected for disposing the second container. In some embodiments, the interior space of an electronic device can include a dedicated structure for housing the second container. In some embodiments, the dedicated structure can be what is referred to as an environmental control module, as described above. An environmental control module can be disposed within the interior space of an electronic device and the second container can be disposed within the environmental control module. In some embodiments, the second container can be made from material including microfiberous polyethylene, microporous polyethylene, high density polyethylene, oriented polystyrene, cellophane, polycarbonate, polyvinylchloride, and combinations thereof.

A wide variety of constructions can be used for the second container. In some embodiments, the second container can be made of material that includes polyethylene (high or low density), polypropylene, polyester, polyethylene terephthalate, polyethylene terephthalate glycol-modified, polyvinyl chloride, polycarbonate, polyamide, polyether, polyetherimide, glass, metal, combinations thereof, and the like.

Modeling data was generated to show how the combination of a desiccant and saturated salt solution can provide robust control of humidity within a hermetically sealed data storage device such as a hard disk drive and is presented in FIGS. 2 and 3 below. The defined environment that was used for generating the modeling data is illustrated in FIG. 1. As shown in FIG. 1, a hermetically sealed data storage device 100 includes a first environmental control module 109 and a second environmental control module 119 disposed within the interior space 105 of device 100, wherein the space 105 has a relative humidity. The first environmental control module 109 includes a saturated salt solution 113 disposed within the interior space 110 of the first environmental control module 109. The interior space 110 has a relative humidity and humidity is exchanged between the saturated salt solution 113 and the space 110 as indicated by arrows 111 and 112. The first environmental control module 109 also includes an aperture 150 so that humidity can transfer between space 105 and 110 as indicated by arrows 151. The second environmental control module 119 includes a desiccant 123 disposed within the interior space 120 of the second environmental control module 119. The interior space 120 has a relative humidity and humidity is exchanged between the desiccant 123 and the space 120 as indicated by arrows 121 and 122. The second environmental control module 109 also includes an aperture 140 so that humidity can transfer between space 105 and 120 as indicated by arrows 141. Also, as shown, an aperture 130 can be included so that humidity can transfer between space 110 and 120 as indicated by arrows 131.

For purposes of generating modeling data, it was assumed that there was diffusion-limited flow between the three spaces (chambers) 105, 110, and 120. For the purposes of generating the modeling data, the flow between the desiccant 123 and the interior space 150 is set to 0. It was also assumed that there is a limited supply of humidity in both the saturated salt solution chamber 110 and the desiccant chamber 120. In a device 100 the available volume may not allow a saturated salt chamber 110 to have adequate capacity for all contingencies. FIGS. 2 and 3 show models for where the saturated salt solution is diluted with excess water and where the saturated salt solution gets dried out. The pre-charged desiccant helps the saturated salt solution control humidity to substantially the same target value as if the saturated salt solution had capacity.

Figure 2:
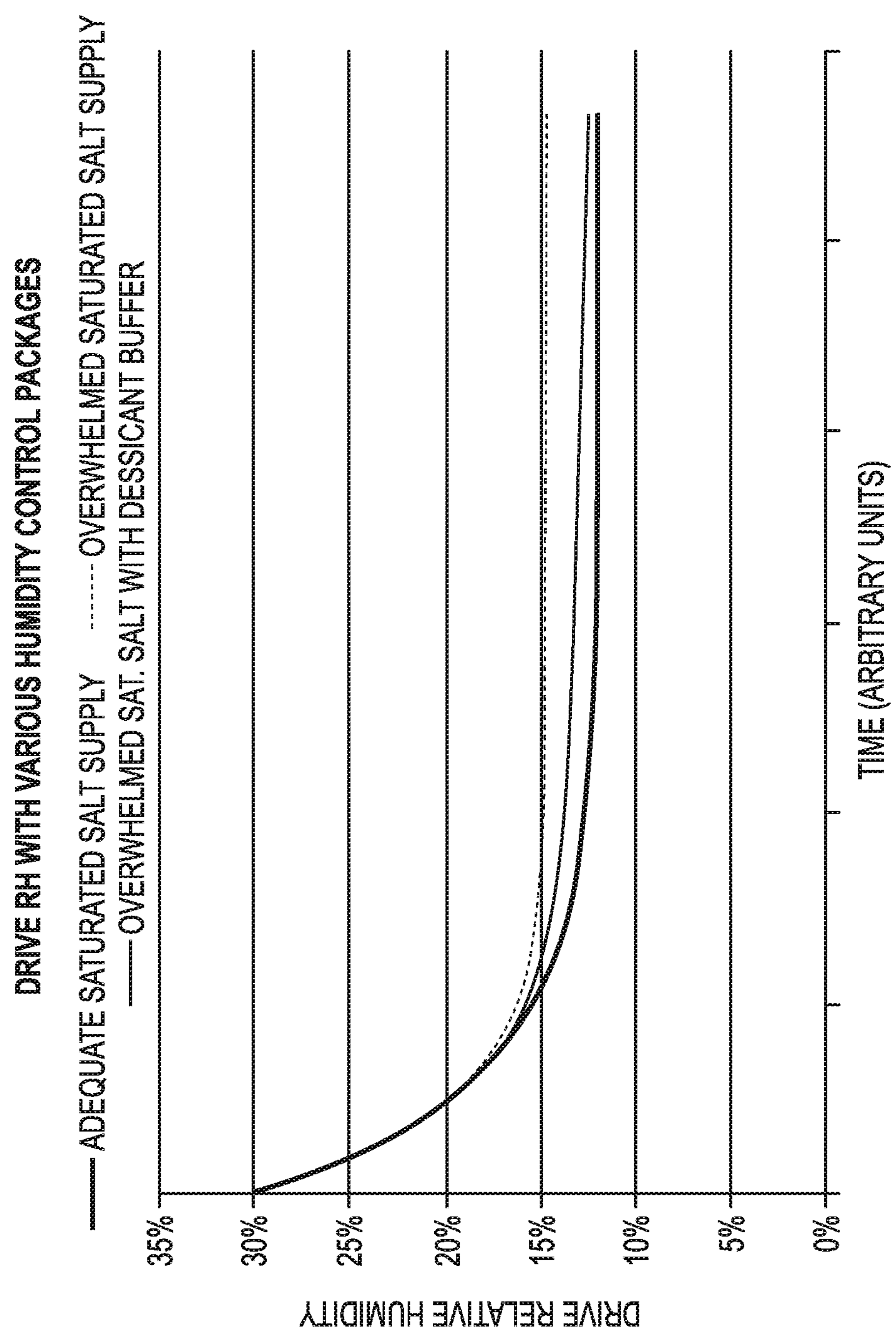
FIG. 2 is a graph showing modeling data according to one scenario.

FIG. 2 illustrates a scenario immediately after a disk drive is sealed. The environment 105 within the device 100 has a high relative humidity. As shown in FIG. 2, an adequately sized saturated salt solution chamber 109 can reduce the device relative humidity to the equilibrium saturated salt solution without the desiccant present. FIG. 2 also shows the situation where a saturated salt solution does not have the capacity to adsorb the humidity. The relative humidity in the device 100 does reduce until the saturated salt solution gets diluted to the point where it no longer has capacity. This can occur due to restrictions on the size of chamber 109 due to the size of device 100. FIG. 2 shows that according to the present disclosure a combination of a desiccant chamber 119 as a buffer and a saturated salt solution chamber 109 can overcome the shortcomings of an inadequately size saturated salt solution chamber 109. As shown in FIG. 2, the desiccant buffer can remove the excess humidity to return the saturated salt solution to a concentration where it is able to control the relative humidity to the equilibrium relative humidity of the saturated salt solution. Accordingly, the combination of passive humidity control modules 109 and 110 can be designed to absorb the excess humidity.

Figure 3:
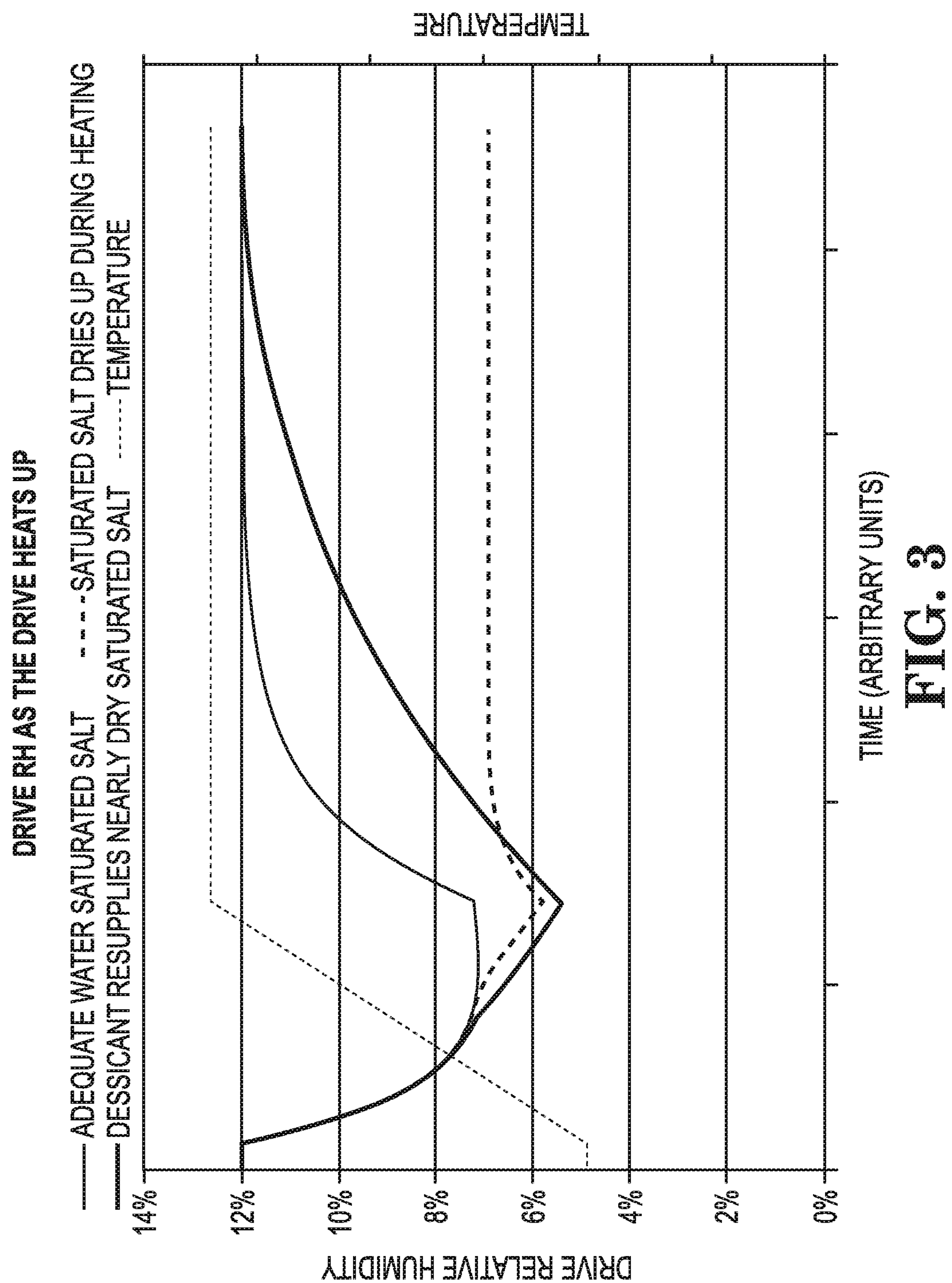
FIG. 3 is a graph showing modeling data according to a second scenario.

FIG. 3 illustrates a scenario when an equilibrated device 100 such as a hard disk drive gets powered up. The drive heats up and the relative humidity drops. As shown in FIG. 3, an adequately sized saturated salt solution chamber 109 can release humidity into space 105 and increase the device relative humidity to the equilibrium saturated salt solution without the desiccant present. FIG. 3 also shows the situation where a saturated salt solution does not contain enough water to humidify chamber 105 and dries out. As can be seen, the saturated salt solution dries up during the heating ramp. The humidity in the device 100 equilibrates at a lower relative humidity than the target humidity. This can occur due to restrictions on the size of chamber 109 due to the size of device 100. FIG. 3 shows that according to the present disclosure a combination of a desiccant chamber 119 as a buffer and a saturated salt solution chamber 109 can overcome the shortcomings of an inadequately sized saturated salt solution chamber 109. As shown in FIG. 3, the desiccant buffer can add humidity to the saturated salt solution chamber 109 if the saturated solution dries up during the temperature ramp to restore the saturated salt solution to a concentration where it is able to control the relative humidity to the equilibrium relative humidity of the saturated salt solution.

A wide variety of electronic devices can use a saturated salt solution and desiccant according to the present disclosure so as to provide a desirable relative humidity within an interior space of the electronic device, especially a hermetically sealed electronic device. In some embodiments, an electronic device is a data storage device. Non-limiting examples of data storage devices include hard disk drives (internal and/or external), network attached storage (NAS), and the like. Examples of hard disc drives are reported in U.S. Pat. No. 7,478,760 (Beatty et al.) and U.S. Pat. No. 7,695,547 (Smith), wherein the entireties of which patents are incorporated herein by reference. A hermetically sealed electronic device can include a housing having an interior space and one or more electronic components disposed within the interior space. A saturated salt solution and desiccant according to the present disclosure can be disposed within the interior space so as to control relative humidity within the interior space.

What is claimed is:

1. An electronic device comprising:

a) a housing having an interior space;

b) one or more electronic components disposed within the interior space;

c) a saturated salt solution disposed within the interior space, wherein the saturated salt solution is contained within a first container that is permeable to water vapor, and impermeable to liquid and ions, and wherein the first container is disposed within the interior space; and d) a desiccant disposed within the interior space, wherein the desiccant is contained within a second container that is permeable to water vapor, and wherein the second container is disposed within the interior space.

2. The electronic device of claim 1, wherein the saturated salt solution can control the relative humidity within the interior space to a relative humidity from 5 to 60 percent at a temperature in the range from 10 to 75° C.

3. The electronic device of claim 1, wherein the salt is chosen from lithium chloride, potassium formate, calcium chloride, magnesium chloride, potassium carbonate, sodium chloride, potassium sulfate, potassium acetate, lithium bromide, desium fluoride, zinc bromide, lithium iodide, and combinations thereof.

4. The electronic device of claim 1, further comprising an environmental control module disposed within the interior space, wherein the first container is disposed within the environmental control module.

5. The electronic device of claim 1, wherein the first container comprises a sealed pouch, wherein the sealed pouch comprises a polymer membrane that is permeable to water vapor, and impermeable to liquid and ions.

6. The electronic device of claim 1, wherein the desiccant is precharged in an environment having a relative humidity in the range from 5 to 60 percent at a temperature in the range from 10 to 30° C.

7. The electronic device of claim 1, wherein the saturated salt solution can control the relative humidity within the interior space to a first relative humidity at a temperature in the range from 10° C. to 75° C., wherein the desiccant is precharged in an environment having a second relative humidity at a temperature in the range from 15 to 30° C., wherein second relative humidity is different from the first relative humidity, and wherein the second relative humidity is within 10% of the first relative humidity at a temperature in the range from 10° C. to 75° C.

8. The electronic device of claim 2, wherein the desiccant is precharged in an environment having a relative humidity in the range from 5 to 60 percent at a temperature in the range from 10 to 30° C.

9. The electronic device of claim 1, wherein the desiccant is chosen from silica gel, activated alumina, alumina, calcium oxide, activated carbon, calcium sulfate, magnesium aluminum silicate, and combinations thereof.

10. The electronic device of claim 1, further comprising an environmental control module disposed within the interior space, wherein the second container is disposed within the environmental control module.

11. The electronic device of claim 1, wherein the electronic device comprises a data storage device.

12. The electronic device of claim 11, wherein the data storage device comprises a hard disk drive.

13. The electronic device of claim 12, wherein the hard disk drive is hermetically sealed.

14. The electronic device of claim 1, wherein the interior space is a first interior space, wherein the first container is disposed in an area of the electronic device that defines a second interior space, wherein the second container is disposed in an area of the electronic device that defines a third interior space, wherein the first, second, and third interior spaces are in fluid communication with each other so that humidity can transfer among the first, second, and third interior spaces.

15. A method of making an electronic device, the method comprising:

a) providing a housing having an interior space;

b) disposing one or more electronic components within the interior space;

c) disposing a first container within the interior space, wherein a saturated salt solution is contained within the first container, and wherein the first container is permeable to water vapor, and impermeable to liquid and ions; and d) disposing a second container within the interior space, wherein a desiccant is contained within the second container, wherein the second container is permeable to water vapor.

16. The method of claim 15, wherein the interior space is a first interior space, wherein the first container is disposed in an area of the electronic device that defines a second interior space, wherein the second container is disposed in an area of the electronic device that defines a third interior space, wherein the first, second, and third interior spaces are in fluid communication with each other so that humidity can transfer among the first, second, and third interior spaces.

17. The method of claim 15, wherein the saturated salt solution can control the relative humidity within the interior space to a relative humidity from 5 to 60 percent at a temperature in the range from 10° C. to 75° C., and wherein the salt is chosen from lithium chloride, potassium formate, calcium chloride, magnesium chloride, potassium carbonate, sodium chloride, potassium sulfate, potassium acetate, lithium bromide, desium fluoride, zinc bromide, lithium iodide, and combinations thereof.

18. The method of claim 15, wherein the first container comprises a sealed pouch, wherein the sealed pouch comprises a polymer membrane that is permeable to water vapor, and impermeable to liquid and ions.

* * * * *